United States Patent
Fritsch et al.

(10) Patent No.: US 6,656,376 B1
(45) Date of Patent: Dec. 2, 2003

(54) PROCESS FOR CLEANING CVD UNITS

(75) Inventors: Elke Fritsch, München (DE); Christine Dehm, München (DE); Hermann Wendt, Grasbrunn (DE); Volker Weinrich, München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/360,944

(22) Filed: Jul. 26, 1999

(30) Foreign Application Priority Data

Jul. 24, 1998 (DE) .......................... 198 33 448

(51) Int. Cl.⁷ .............................. B44C 1/22; C23F 3/00
(52) U.S. Cl. ........................... 216/75; 216/74; 134/1.3; 134/2; 134/26; 438/905
(58) Field of Search .................. 216/74, 75; 134/1.3, 134/26, 2, 30; 438/905; 252/79.1

(56) References Cited

U.S. PATENT DOCUMENTS

| | | | |
|---|---|---|---|
| 5,094,701 A | * 3/1992 | Norman et al. | 148/23 |
| 5,362,328 A | * 11/1994 | Gardiner et al. | 118/726 |
| 5,431,774 A | * 7/1995 | Douglas | 216/57 |
| 5,453,494 A | * 9/1995 | Kirlin et al. | 534/15 |
| 5,685,918 A | * 11/1997 | Tate | 134/22.13 |
| 5,705,443 A | * 1/1998 | Stauf et al. | 204/192.35 |
| 5,782,986 A | 7/1998 | Butterbaugh et al. | 134/1.3 |
| 5,993,679 A | * 11/1999 | Koide et al. | 216/74 |
| 6,143,191 A | * 11/2000 | Baum et al. | 216/63 |

FOREIGN PATENT DOCUMENTS

EP     0701274 A1     3/1996

OTHER PUBLICATIONS

"Preparation and Characterization of $(Sr_{1-x}Ti_x)O_3$ and $(Ba_{1-x}Sr_x)TiO_3$ Thin Films Using ECR Plasma Assisted MOCVD", No et al., Department of Materials Science and Engineering, Korea Advanced Institute of Science and Technology, Taejon, Korea.

Volatile Barium β–Diketonate Polyether Adducts. Synthesis, Characterization, and Metalloorganic Chemical Vapor Deposition, R. Gardiner et al., American Chemical Society, 1991, pp. 1053–1059.

Chemical Abstract No. 124:103092 (Thin Solid Films), vol. 269 (1–2), 1995.

Chemical Abstract No. 129:283980 (Contamination Control), 1998.

* cited by examiner

Primary Examiner—Robert Kunemund
Assistant Examiner—Shamim Ahmed
(74) Attorney, Agent, or Firm—Laurence A. Greenberg; Werner H. Stemer; Gregory L. Mayback

(57) ABSTRACT

A cleaning process for cleaning CVD units is disclosed. In the cleaning process, alkaline earth metal and/or metal-containing process residues, which form an amorphous film on reactor walls, are removed using a dry etching medium containing free diketones at a greatly reduced pressure and an elevated temperature. In the process, the free diketones react with the alkaline earth metals or metals to form volatile complexes.

27 Claims, 1 Drawing Sheet

PROCESS FOR CLEANING CVD UNITS

BACKGROUND OF THE INVENTION

Field of the Invention

The invention is in the area of semiconductor technology and relates to a process for cleaning CVD units.

In process reactors for the deposition of oxide ceramics on semiconductor substrates, the interior walls of the reactor, in addition to the substrates to be processed, are also coated with oxide ceramics. As a consequence of the deposition processes, the interior walls of the reactor have an amorphous coating of metal oxides or alkaline earth metal oxides, hydroxides, carbonates and organic precursor residues (residues of precursor compounds). Such deposits must be regularly removed in order to prevent substrate contamination.

One way of cleaning process units is by wet-chemical or mechanical cleaning. In this case, however, the reactor space must be opened to the clean room, which can contaminate the latter. In addition, these cleaning processes are generally carried out manually in a very time-consuming manner.

A second possibility includes using back-sputtering methods, for example argon sputtering. In this process, however, shadowing results in that not all areas of the interior walls of the reactor are cleaned. In addition, the back-sputtering results in attacks on the interior walls of the reactor, which usually are formed stainless steel.

The use of dry etchants opens up a further way of cleaning the interior walls of reactors. A suitable process is revealed, for example, by a paper by Jain et al. in "Thin Solid Films", Vol. 269, pgs. 51–56, from 1995. The paper deals with the use of b-diketones for removing copper residues. Further processes using b-diketones are disclosed in Published, European Patent Application EP 0 701 274 A1, U.S. Pat. No. 5,094,701 and U.S. Pat. No. 5,782,986. However, it has been found that the processes proposed therein are only of limited suitability for cleaning the interior walls of CVD unit reactors coated with residues containing alkaline earth metals.

SUMMARY OF THE INVENTION

It is accordingly an object of the invention to provide a process for cleaning CVD units which overcome the above-mentioned disadvantages of the prior art methods of this general type, which enables simple cleaning of CVD units.

With the foregoing and other objects in view there is provided, in accordance with the invention, a process for cleaning chemical vapor deposition (CVD) units used for depositing oxide ceramics, the CVD units have surfaces facing a process space being coated with residues containing at least one of alkaline earth metals and metals, which includes:

carrying out a cleaning process using an etching medium containing diketones including free diketones coming into contact with process residues, the free diketones reacting with process residues to form at least one of alkaline earth metal complexes and metal complexes; and forming the etching medium with at least one compound selected from the group consisting of ammonia, amines, polyether additives, polyamine additives and tetraglyme for preventing oligomerization of the alkaline earth metal complexes and the metal complexes.

The object is achieved according to the invention by a process for cleaning CVD units used for depositing oxide ceramics. During the depositing process, surfaces of the CVD units facing the process space are coated with process residues containing alkaline earth metals and/or metals. The cleaning of the CVD units is carried out using an etching medium containing free diketones which comes into contact with the process residues. The diketones react with the process residues to form alkaline earth metal and/or metal complexes, and the etching medium contains, in order to prevent oligomerization of the alkaline earth metal and/or metal complexes, at least one compound from the group consisting of ammonia, amines, polyether additives, polyamine additives and tetraglyme.

The process residues containing metals and in particular alkaline earth metals are attacked by the diketones, which are present in adequate concentration and are generally in unbound form, and form therewith volatile alkaline earth metal or metal complexes. In order to support these reactions, the gaseous etching medium is introduced into the reactor space at, for example, an elevated temperature and at greatly reduced pressure. The amount of diketones fed in and the feed rate thereof depend on the size of the reactor space and on the amount of process residues to be removed. The introduction of the etching medium into the reactor space preferably takes place via the feed systems already present in the CVD units. These include, for example, pipelines for media supply and devices for dispersing or evaporating liquids. The diketones are preferably fed in at the elevated temperature, so that they are in gaseous form. Even if they are introduced in liquid form, the diketones are thus already in gaseous form when they come into contact with the process residues. The etching medium preferably comes into contact with the process residues under a greatly reduced pressure and at an elevated temperature compared with standard normal conditions. Under these conditions, the complexes formed at the elevated temperature from the free diketones and the alkaline earth metals or metals are likewise gaseous and can sublime rapidly from the interior walls of the reactor and can thus easily be removed from the interior of the reactor. Under the selected conditions (pressure and temperature), the volatility of the resultant complexes is promoted. Standard normal conditions correspond to a pressure of about 105 Pa and a temperature of about 20° C.

The cleaning process according to invention is advantageously suitable for in-situ cleaning of CVD units, achieving rapid cleaning and reduced environmental pollution. Furthermore, use of the feed systems already present in the CVD units for the etching medium produces the same spatial concentration distribution in the process space as also occurs during deposition of the substances to be deposited. If some areas in the process space are afflicted with greater deposits owing to non-uniform distribution of the substances to be deposited, the concentration of the etchant in these areas is also increased. This results, advantageously, in a higher etching rate in areas with greater deposits. By contrast, significant overetching in less afflicted areas can be substantially excluded.

The interior walls of the reactor to be cleaned usually consist of stainless steel or other inert metal surfaces. The cleaning process according to the invention advantageously allows metal-containing or alkaline earth metal-containing oxides, hydroxides, carbonates and precursor residues of oxide ceramics deposits to be removed.

An advantageous embodiment of the invention is characterized in that sterically hindered and/or fluorine-containing diketones are used.

Sterically hindered and fluorine-containing diketones have proven particularly advantageous. Fluorine-containing diketones have high etching rates, for example owing to their high volatility, whereas sterically hindered diketones, owing to their molecular structure, prevent the bonded metals from forming complexes with other ligands owing to steric screening. The sterically hindered diketones in particular prevent multiple complex formation, which results in oligomerization and thus in the formation of low-volatility complexes.

A further advantageous embodiment of the invention is characterized in that the greatly reduced pressure is below 2000 Pa, preferably below 200 Pa.

A further advantageous embodiment of the invention is characterized in that the elevated temperature is between 200° C. and 300° C., in particular between 230° C. and 250° C.

Very good cleaning results can be achieved at a pressure of about 200 Pa or below. For a further improvement in cleaning, a temperature of between 230° C. and 250° C. is used. This temperature is on the one hand sufficient for the formation of volatile metal complexes, while on the other hand the chamber walls and sealants for sealing the reactor space are only affected to a small degree. It is furthermore advantageous that the interior walls of the reactor are themselves not attacked by the diketones. The cleaning process according to the invention also makes it unnecessary to use an oxidizing atmosphere, which represents an additional stress for the interior walls of the reactor.

The greatly reduced pressure and the elevated temperature are preferably kept essentially constant throughout the cleaning operation. This allows uniform and continuous cleaning. In the cleaning process, which is thus one-step, the etching medium is fed continuously to the CVD reactor and the volatile complexes formed are continuously removed therefrom.

A two-step process is furthermore preferred. In this case, the process is characterized in that at least one cleaning cycle is provided in which the etching medium comes into contact with the process residues at a first pressure and a first temperature. The etching medium then acts on the process residues for a specified time, during which the free diketones together with the process residues form the alkaline earth metal or metal complexes and essentially remain on the surface at the first temperature and the first pressure. The alkaline earth metal or metal complexes are subsequently removed from the surfaces at an elevated temperature and is greatly reduced pressure compared with standard normal conditions.

A further aspect of the invention relates to a process for cleaning CVD units which are used for deposition of oxide ceramics and whose surfaces facing a process space are coated with process residues containing alkaline earth metals and/or metals, where the process has at least one cleaning cycle in which the cleaning is carried out using an etching medium containing free diketones. The etching medium comes into contact with the process residues at a first pressure and a first temperature. The etching medium then acts on the process residues for a specified time, during which the free diketones together with the process residues form the alkaline earth metal or metal complexes and they essentially remain on the surface at the first temperature and the first pressure. The alkaline earth metal or metal complexes are subsequently removed from the surfaces at an elevated temperature and greatly reduced pressure compared with standard normal conditions.

It proves advantageous here that the etching medium is also introduced into the CVD reactor at an increased pressure, for example standard atmospheric pressure. The free diketones are thus simultaneously present in higher concentration and can react with the process residues during the specified time, which can be between a few minutes and a few hours. The time should preferably be selected so that very substantially all diketones react with the process residues. This measure increases the cleaning quality and reduces the amount of diketones required. After the formation of the metal or alkaline earth metal complexes, the temperature is increased and the pressure reduced, so that the complexes sublime from the surfaces and can be removed from the CVD reactor, for example by pumping.

The cleaning cycle is preferably carried out a number of times, in particular at least twice. If necessary, it is favorable to limit the action time of the diketones to a time between 10 and 60 minutes.

A further advantageous embodiment of the invention is characterized in that the diketones used are hexafluoroacetylacetone and/or tetramethylheptanedione.

Very good cleaning results are achieved using hexafluoroacetylacetone (Hhfac) $F_3C—C(O)—CH_2—C(O)—CF3$ or tetra-methylheptanedione (Hthd) $(H_3C)_3C—C(O)—CH_2—C(O)—C(CH_3)_3$. These reagents prove particularly advantageous for eliminating barium and strontium compounds.

A further advantageous embodiment of the invention is characterized in that the concentration of the diketones in the etching medium is set so that oligomerization of the volatile alkaline earth metal and metal complexes is prevented.

An excess of free diketones effectively prevents oligomerization of the metal complexes formed. Redeposition of the metal complexes formed is thus prevented.

A further advantageous embodiment of the invention is characterized in that the etching medium contains ammonia or amines for preventing oligomerization of the volatile alkaline earth metal and metal complexes.

Oligomerization of the volatile alkaline earth metal and metal complexes can be excluded much more simply and inexpensively by adding ammonia or amines. Etchants containing diketones and ammonia or amines are also highly suitable for cleaning other substrate surfaces, for example of semiconductor materials containing silicon or silicon dioxide. Experiments have furthermore shown that better cleaning results are achieved in the presence of ammonia.

A further advantageous embodiment of the invention is characterized in that the etching medium contains polyether additives or polyamine additives for stabilizing the volatile alkaline earth metal and metal complexes formed, in particular tetraglyme, $CH_3—O—(CH_2—CH_2—O)_4—CH_3$.

Tetraglyme in particular stabilizes the resultant metal complexes at an elevated temperature and thus likewise counteracts oligomerization. Generally, the stabilization of the metal complexes supports the prevention of the oligomerization of the metal and alkaline earth metal complexes as well.

A further advantageous embodiment of the invention is characterized in that the volatile alkaline earth metal and metal complexes are bound in a cold trap.

The volatile alkaline earth metal and metal complexes removed from the interior of the reactor after the cleaning can advantageously be concentrated in a cold trap. This firstly removes them from the exhaust air in order to reduce environmental pollution, and secondly, they are available for further use. Suitable cold traps are, for example, water-cooled deposition apparatuses.

A further advantageous embodiment of the invention is characterized in that the diketones that have not formed a complex compound during the cleaning are neutralized in a methanolic hydroxide solution.

Excess diketones that have not formed a complex compound during the cleaning can be neutralized in a methanolic hydroxide solution, preferably in a potassium hydroxide solution. Here too, environmental pollution is prevented and recovery of the diketones facilitated.

A further advantageous embodiment of the invention is characterized in that the volatile alkaline earth metal and metal complexes are used for recovery of starting materials for oxide ceramic deposition.

The alkaline earth metal and metal complexes bound in a cold trap or another suitable deposition system after the cleaning can advantageously be used for recovery of starting materials for oxide ceramic deposition. To this end, the complexes are separated from one another in a suitable manner, concentrated and purified, forming so-called precursor compounds, such as, for example, diketone complexes with barium and strontium. Since the cleaning of the interior walls of the reactor essentially utilizes the reverse reaction to oxide ceramic deposition, the volatile alkaline earth metal and metal complexes formed are thus already the starting materials for oxide ceramic deposition or can easily be converted thereto.

A dry etching medium is preferably used, i.e. the etching medium is in a gaseous form.

Other features which are considered as characteristic for the invention are set forth in the appended claims.

Although the invention is illustrated and described herein as embodied in a process for cleaning CVD units, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
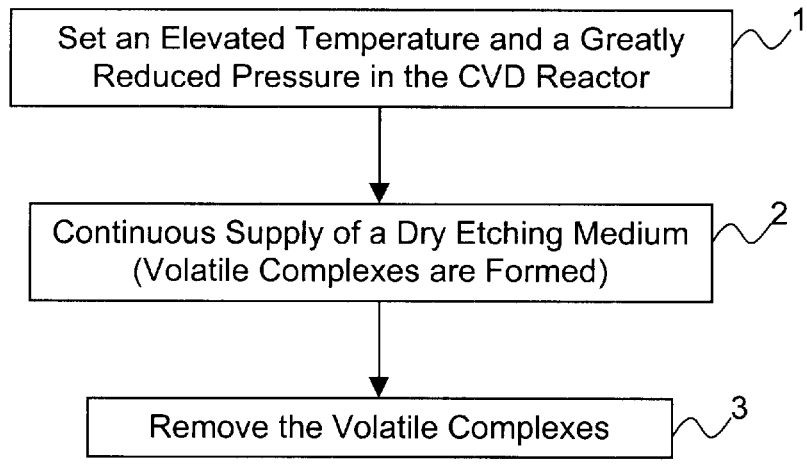
FIG. 1 is flow chart describing a process for cleaning CVD units according to the invention.

In all the figures of the drawing, sub-features and integral parts that correspond to one another bear the same reference symbol in each case. Referring now to the figures of the drawing in detail and first, particularly, to FIG. 1 thereof, there is shown a flow chart describing a process for cleaning CVD units.

In a metal-organic chemical vapor deposition (MOCVD) unit used for the deposition of Perovskite ceramics, an amorphous layer of precursor residues, metal oxides, hydroxides and carbonates is formed on the interior walls of the reactor after a number of process cycles. This layer, which is neither mechanically nor chemically stable, can lead to contamination of the substrates to be processed and must therefore be removed regularly. The deposits contain, for example, compounds of strontium, bismuth, tantalum, lead, zirconium and titanium. This is referred to below as deposits.

In order to remove such deposits, the process reactor space is to a pressure of below 200 Pa and the reactor walls are warmed to a temperature of between 230° C. and 250° C. in a first step 1. In step 2, the etchant, here in the form of a dry etchant, is subsequently passed into the reactor space via a dispersion device. The etchant, here in the form of a dry etchant, is subsequently fed into the reactor space. The etchant contains hexafluoroacetylacetone (Hhfac) or tetramethylheptanedione (Hthd). The diketones are dissolved in a non-polar hydrocarbon in a concentration of about 0.5 mol/l. The etching medium furthermore contains tetraglyme. If desired, it may also be possible for ammonia to be passed into the reactor space via a separate gas line, which should take place simultaneously with the dissolved diketones. The etching medium, which is gaseous at 230° C., comes into contact with the deposits, forming metal-containing complex compounds.

As an example, the reaction of barium oxide with etramethylheptanedione is shown as:

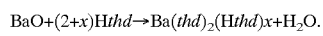

$$BaO+(2+x)Hthd \rightarrow Ba(thd)_2(Hthd)x+H_2O.$$

Strontium oxide reacts with hexafluoroacetylacetone in accordance with the following equation:

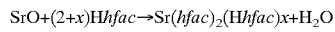

$$SrO+(2+x)Hhfac \rightarrow Sr(hfac)_2(Hhfac)x+H_2O$$

Analogous reactions apply for other compounds of barium, strontium, bismuth, tantalum, lead, zirconium and titanium.

After the above reaction, the metal complexes formed can easily be sublimed from the interior walls of the reactor and are extracted from the interior of the reactor by an air extraction system in step 3. The introduction of the etching medium and the extraction of the metal complexes are preferably carried out continuously. In a downstream cold trap, the metal complexes are removed from the etching medium and concentrated in the cold trap. From there, they can be removed for recovery of starting materials for oxide ceramic deposition. By contrast, pure diketones are neutralized in a methanolic potassium hydroxide solution.

In order to prevent oligomerization of the metal complexes formed and their deposition on the interior walls of the reactor, ammonia or tetraglyme is added to the etching medium. The prevention of oligomerization furthermore simplifies the recovery of starting materials from the metal complexes collected in the cold trap.

Figure 2:
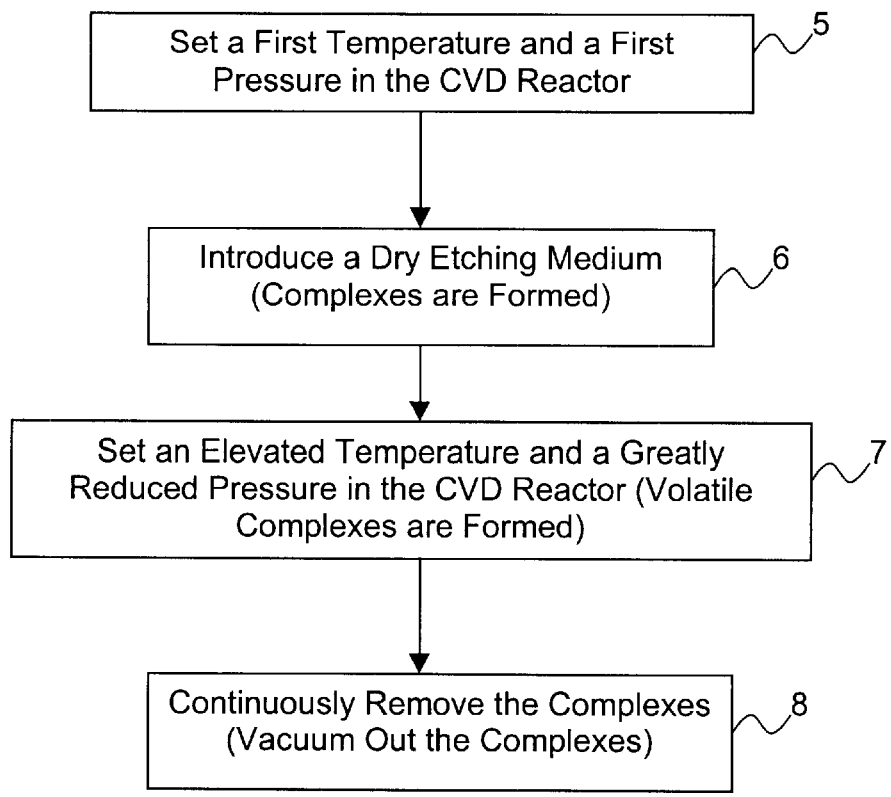
FIG. 2 is a flow chart further describing a second embodiment of the process for cleaning the CVD units.

In FIG. 2, a second embodiment of the process for cleaning the CVD units is described. For the cleaning of the CVD unit, a first pressure and a first temperature are set therein at step 5. The etching medium is preferably fed to the CVD unit under standard normal conditions, i.e. at about 20° C. and 105 Pa.

It also proves favorable to increase the first temperature in order to support the cleaning effect. For example, the first temperature can also be from 50° C. to 100° C., or even 200° C. It is furthermore advisable to reduce the first pressure slightly within the CVD unit compared with standard normal conditions in order to remove airborne particles by partial evacuation of the CVD unit before the actual cleaning.

If necessary, the CVD unit should be pre-cleaned with a flushing gas before the cleaning.

In step 6, an introduction of the etching medium is followed by a certain action time. The time specified here should preferably be such that the largest possible proportion of the diketones and process residues can be converted into metal or alkaline earth metal complexes. After, for example, 30 to 60 minutes, the temperature of the CVD unit is set to an elevated temperature in step 7. The complexes formed beforehand, which are volatile at the elevated temperature, are preferably removed from the CVD unit at the same time. This is achieved by extraction of the complexes (step 8) while simultaneously reducing the pressure. After removal of the complexes to the greatest possible degree, the cleaning process can, if necessary, be repeated as often as desired. The extraction is followed, if desired, by a rinsing step.

We claim:

1. A process for cleaning chemical vapor deposition (CVD) units used for depositing oxide ceramics, the CVD units have surfaces facing a process space being coated with residues containing alkaline earth metals, which comprises:
    carrying out a cleaning process using an etching medium containing diketones including free diketones coming into contact with process residues, the free diketones reacting with process residues to form alkaline earth metal complexes; and
    forming the etching medium with at least one compound selected from the group consisting of ammonia, amines, polyether additives, polyamine additives and tetraglyme for preventing oligomerization of the alkaline earth metal complexes.

2. The process according to claim 1, which comprises using at least one of sterically hindered and fluorine-containing diketones in the etching medium.

3. The process according to claim 2, which comprises using at least one of hexafluoroacetylacetone and tetramethylheptanedione as the diketones.

4. The process according to claim 1, which comprises performing the cleaning process at a greatly reduced pressure and at an elevated temperature in comparison with standard normal conditions resulting in a formation of at least one of the alkaline earth metal complexes and the metal complexes when the etching medium comes into contact with the process residues.

5. The process according to claim 4, which comprises keeping the greatly reduced pressure and the elevated temperature substantially constant throughout the cleaning process step.

6. The process according to claim 4, which comprises setting the greatly reduced pressure to be below 200 Pa.

7. The process according to claim 4, which comprises setting the elevated temperature to between 200° C. and 300° C.

8. The process according to claim 7, which comprises setting the elevated temperature to between 230° C. and 250° C.

9. The process according to claim 1, which comprises performing at least one cleaning cycle of the cleaning process, which includes:
    putting the etching medium into contact with the process residues at an initial pressure and an initial temperature, the etching medium acting on the process residues for a specified time, during which the free diketones together with the process residues form the alkaline earth metal complexes, the alkaline earth metal complexes remaining on surfaces of a CVD unit being cleaned at the initial temperature and the initial pressure; and
    removing subsequently the alkaline earth metal complexes from the surfaces at an elevated temperature and a greatly reduced pressure compared with standard normal conditions.

10. The process according to claim 9, which comprises setting the initial pressure and the initial temperature to approximately the standard normal conditions.

11. The process according to claim 9, which comprises setting the greatly reduced pressure to below 200 Pa.

12. The process according to claim 9, which comprises setting the elevated temperature to between 200° C. and 300° C.

13. The process according to claim 12, which comprises setting the elevated temperature to between 230° C. and 250° C.

14. The process according to claim 9, which comprises carrying out the at least one cleaning cycle at least two successive times.

15. The process according to claim 1, which comprises setting a concentration of the diketones in the etching medium so that oligomerization of the alkaline earth metal complexes is prevented.

16. The process according to claim 1, which comprises bounding the alkaline earth metal complexes in a cold trap.

17. The process according to claim 1, which comprises neutralizing the diketones that have not formed a complex compound during the cleaning process in a methanolic hydroxide solution.

18. The process according to claim 1, which comprises recovering starting materials for use in oxide ceramic deposition from the alkaline earth metal complexes.

19. The process according to claim 1, which comprises using a dry etching medium as the etching medium.

20. A process for cleaning chemical vapor deposition (CVD) units used for depositing oxide ceramics, the CVD units have surfaces facing a process space being coated with residues containing alkaline earth metals, which comprises:
    performing at least one-cleaning cycle, which includes;
        starting a cleaning process using an etching medium containing diketones including free diketones;
        including in the etching medium a ligand selected from the group consisting of ammonia, amines, polyether additives, polyamine additives, and tetraglyme for preventing oligomerization of the alkaline earth metal complexes;
        putting the etching medium into contact with process residues at an initial pressure and an initial temperature, the etching medium acting on the process residues for a specified time, during which the free diketones together with the process residues alkaline earth metal complexes, the alkaline earth metal complexes substantially remaining on surfaces of a CVD unit being cleaned at the initial temperature and the initial pressure; and
        removing subsequently the alkaline earth metal complexes from the surfaces at an elevated temperature and at a greatly reduced pressure compared with standard normal conditions.

21. The process according to claim 20, which comprises setting the initial pressure and the initial temperature to approximately the standard normal conditions.

22. The process according to claim 20, which comprises setting the greatly reduced pressure to below 200 Pa.

23. The process according to claim 20, which comprises setting the elevated temperature to between 200° C. and 300° C.

24. The process according to claim 20, which comprises setting the elevated temperature to between 230° C. and 250° C.

25. The process according to claim 20, which comprises carrying out the at least one cleaning cycle at least two successive times.

26. The process according to claim 1, which further comprises including further metals other than alkaline earth metals in the residue.

27. The process according to claim 1, which further comprises maintaining a non-oxidizing atmosphere in the CVD unit.

* * * * *